(12) United States Patent
Park et al.

(10) Patent No.: US 11,340,297 B2
(45) Date of Patent: May 24, 2022

(54) RELAY EXAMINATION DEVICE AND BATTERY MANAGEMENT SYSTEM

(71) Applicant: SK INNOVATION CO., LTD., Seoul (KR)

(72) Inventors: Byoung Kyu Park, Daejeon (KR); Ho Sang Jang, Daejeon (KR); Seon Yong Kim, Daejeon (KR); Yong Sug Choi, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 65 days.

(21) Appl. No.: 16/839,845

(22) Filed: Apr. 3, 2020

(65) Prior Publication Data

US 2020/0326374 A1 Oct. 15, 2020

(30) Foreign Application Priority Data

Apr. 10, 2019 (KR) .................. 10-2019-0041782

(51) Int. Cl.
| | | |
|---|---|---|
| *H02H 7/00* | (2006.01) | |
| *G01R 31/327* | (2006.01) | |
| *H01H 47/00* | (2006.01) | |
| *H02H 7/22* | (2006.01) | |
| *H02H 1/00* | (2006.01) | |
| *H02J 7/00* | (2006.01) | |

(52) U.S. Cl.
CPC ....... *G01R 31/3278* (2013.01); *H01H 47/002* (2013.01); *H02H 1/0007* (2013.01); *H02H 7/22* (2013.01); *H02J 7/0013* (2013.01)

(58) Field of Classification Search
None
See application file for complete search history.

(56) References Cited

U.S. PATENT DOCUMENTS

| | | | | |
|---|---|---|---|---|
| 2007/0115604 | A1* | 5/2007 | Zettel ................. | G01R 31/3278 361/160 |
| 2018/0315568 | A1* | 11/2018 | Zhao ..................... | B60L 3/0046 |
| 2019/0115175 | A1* | 4/2019 | Saito .................... | H01H 47/002 |

FOREIGN PATENT DOCUMENTS

| | | |
|---|---|---|
| JP | 2011-055631 A | 3/2011 |
| KR | 20-1999-0023364 A | 7/1999 |
| KR | 10-2015-0137677 A | 12/2015 |

* cited by examiner

*Primary Examiner* — Stephen W Jackson
(74) *Attorney, Agent, or Firm* — IP & T Group LLP

(57) ABSTRACT

The present disclosure relates to a relay examination device and a battery management system including the same, the relay examination device includes a first resistor unit having one end connected to one end of a relay, a second resistor unit having one end connected to the other end of the first resistor unit, a power unit connected to the other end of the second resistor unit and configured to supply power, and a control unit configured to receive a voltage signal applied between the first resistor unit and the second resistor unit and to examine whether the relay is open or closed or whether the relay has malfunctioned.

11 Claims, 3 Drawing Sheets

RELAY EXAMINATION DEVICE AND BATTERY MANAGEMENT SYSTEM

CROSS-REFERENCE TO RELATED APPLICATION(S)

This application claims priority to Korean Patent Application No. 10-2019-0041782 filed on Apr. 10, 2019 in the Korean Intellectual Property Office, the disclosure of which is herein incorporated by reference in its entirety.

BACKGROUND

Example embodiments of the present disclosure relate to a relay examination device and a battery management system.

A relay may be used to connect a high voltage battery to an automobile system, such as an inverter, or to disconnect a high voltage battery from an automobile system in an electrical vehicle or a hybrid vehicle. A relay may connect a battery only when a vehicle is driven or is charged, and when a vehicle is not used, a relay may completely disconnect a battery from a vehicle system.

Also, to prevent damages to a vehicle system or a driver caused by a high voltage or a current of the battery, a relay may perform a safety function of forcibly disconnecting a battery when an electrical vehicle malfunctions. As such, a relay of a high voltage battery may be an important component in an electrical vehicle, and a function of monitoring an operation of a relay may be necessary.

SUMMARY

An example embodiment of the present disclosure is to provide a relay examination device which may use a separate power such that the relay examination device may not be affected by a level and fluctuations of a voltage of a high voltage battery and may accurately examine a state of a relay, and a battery management system including the same.

An example embodiment of the present disclosure is to provide a relay examination device which may significantly reduce additional elements required to examine a state of a relay such that the relay examination device may include a simplified and inexpensive circuit and may accurately examine a state of the relay, and a battery management system including the same.

According to an example embodiment of the present disclosure, a relay examination device is provided, the relay examination device including a first resistor unit having one end connected to one end of a relay, a second resistor unit having one end connected to the other end of the first resistor unit, a power unit connected to the other end of the second resistor unit and configured to supply power, and a control unit configured to receive a voltage signal applied between the first resistor unit and the second resistor unit and to examine whether the relay is open or closed or whether the relay has malfunctioned.

According to an example embodiment of the present disclosure, a battery management system which examines whether a relay, connected to a negative electrode or a positive electrode of a battery in which a plurality of battery cells are electrically connected to each other in series or in parallel, is open or closed or whether the relay has malfunctioned is provided, the battery management system including a relay examination device connected to one end of the relay, wherein the relay examination device includes a power unit configured to supply a current to the one end of the relay, a voltage detection unit configured to detect a voltage from the one end of the relay, and a control unit configured to examine whether the relay is open or closed or whether the relay has malfunctioned based on the voltage.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
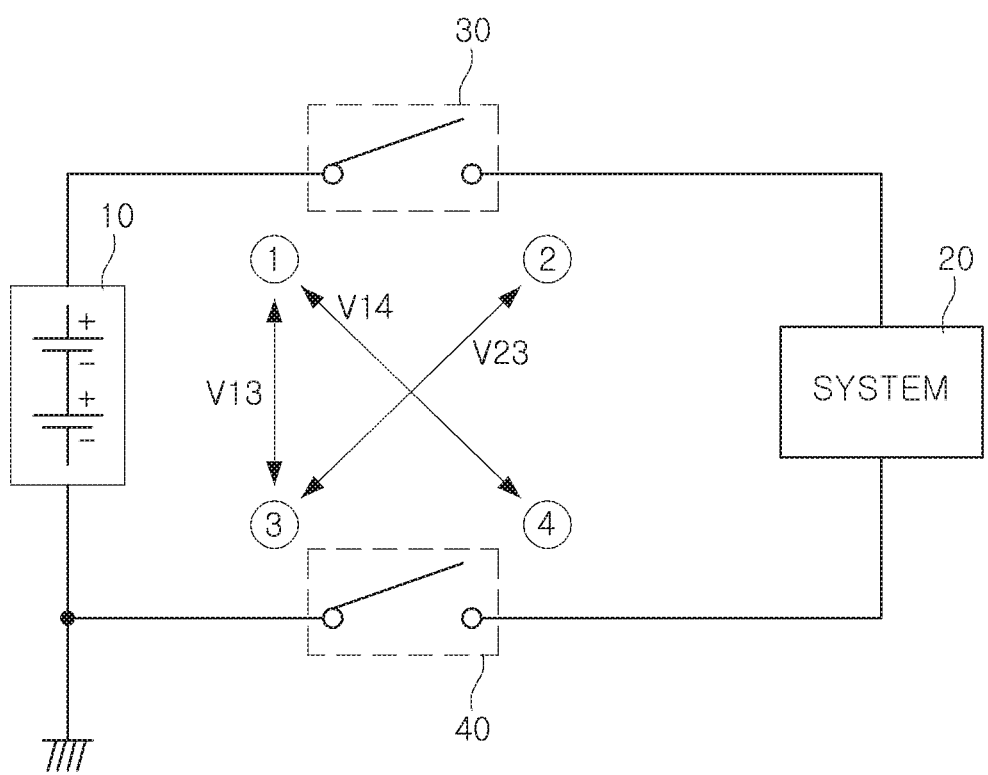
FIG. 1 is a diagram illustrating a connection relationship among a battery, a relay, and a system.

Hereinafter, embodiments of the present disclosure will be described as follows with reference to the accompanied drawings.

The present disclosure is not limited to exemplary embodiments, and it is to be understood that various modifications can be made without departing from the spirit and scope of the present disclosure. In the drawings, the same elements will be indicated by the same reference numerals.

FIG. 1 is a diagram illustrating a connection relationship among a battery, a relay, and a system in a battery management system.

As illustrated in FIG. 1, in a battery management system, a first relay 30 and a second relay 40 may be connected to a positive electrode and a negative electrode of a battery 10, respectively, in series. In the description below, the first relay 30 having one end connected to a positive electrode terminal of the battery 10 will be referred to as a positive electrode relay, and the second relay 40 having one end connected to a negative electrode terminal of the battery 10 will be referred to as a negative electrode relay.

Figure 2:
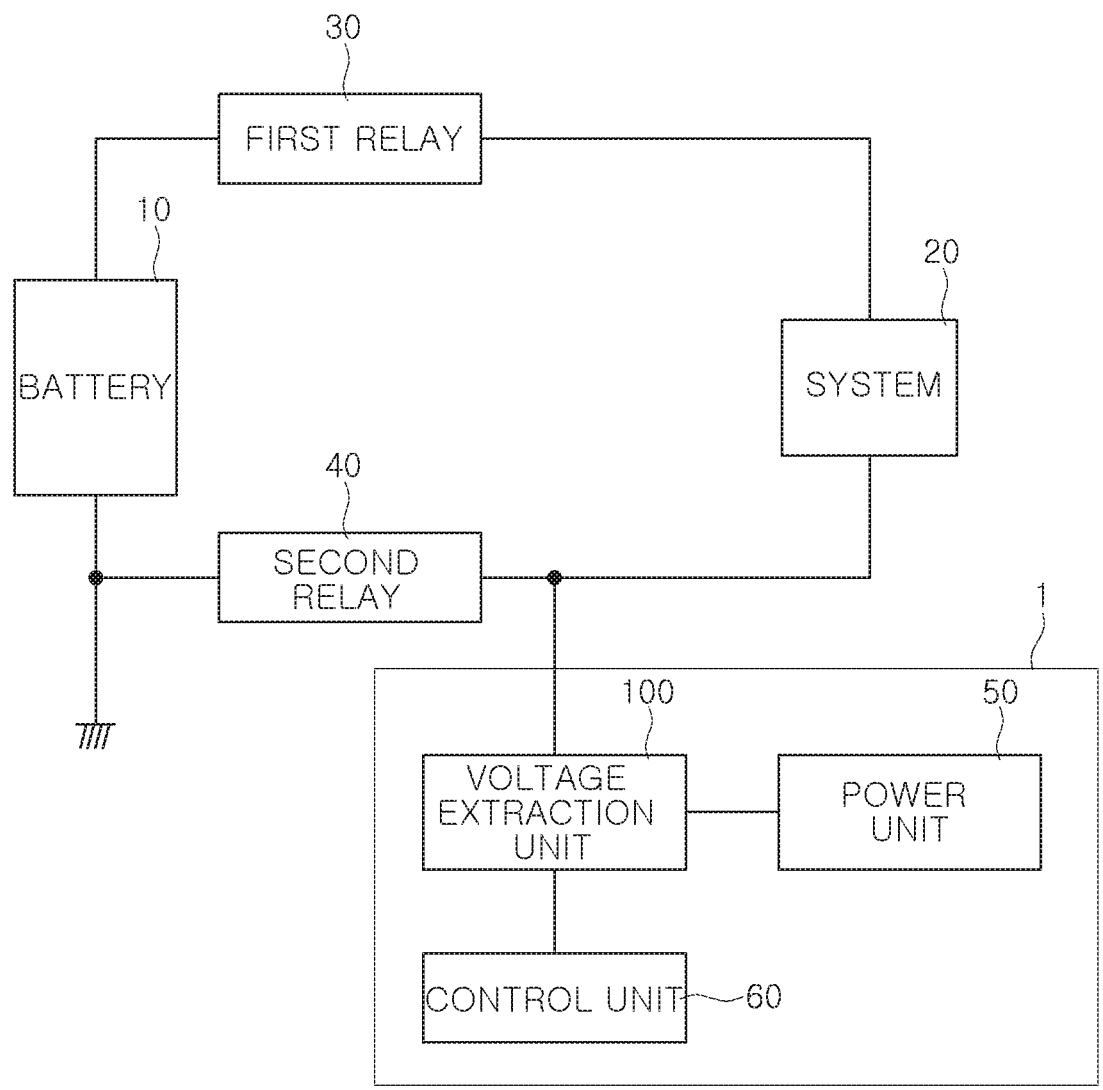
FIG. 2 is a block diagram illustrating a battery management system according to an example embodiment of the present disclosure.
Figure 3:
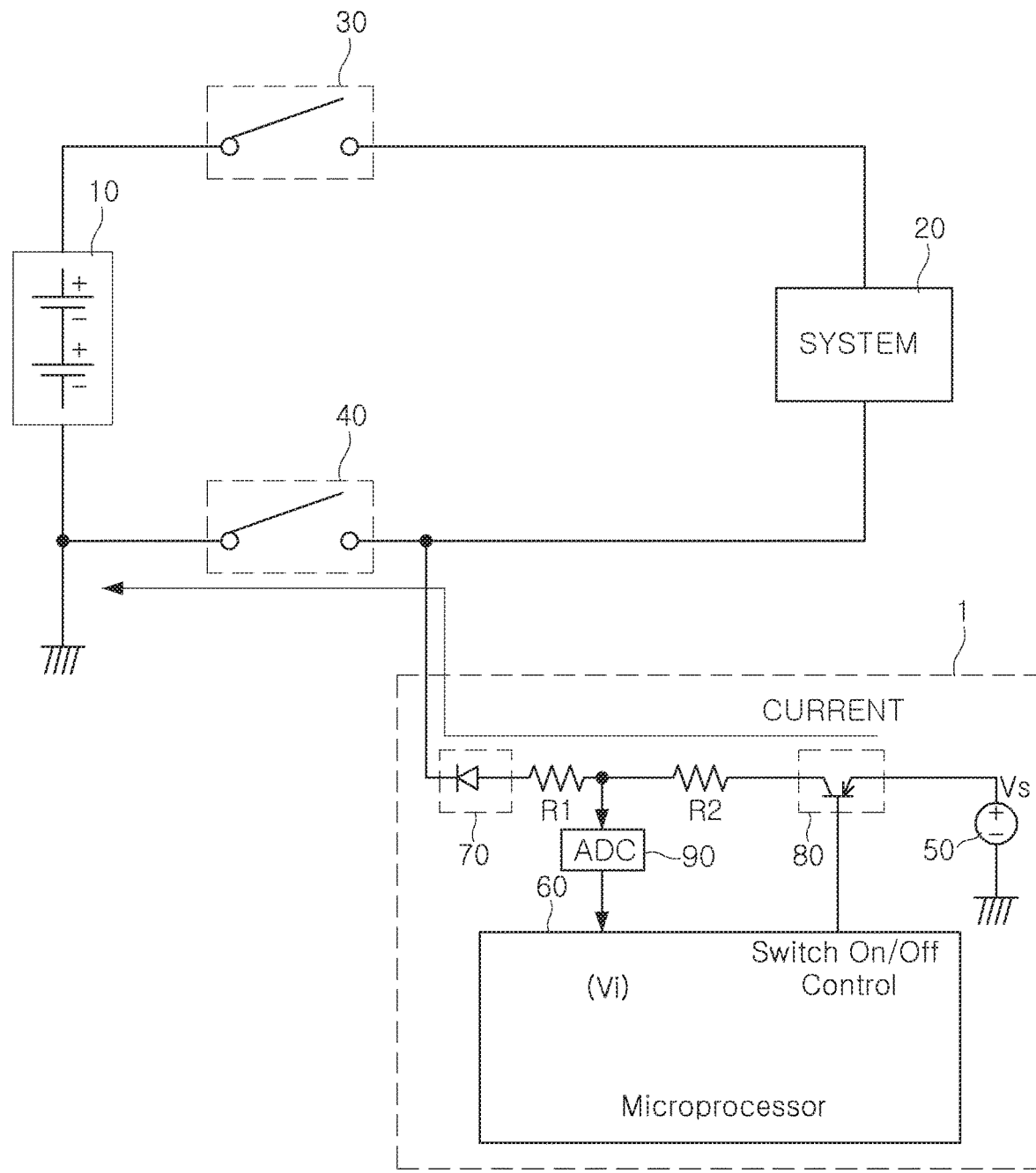
FIG. 3 is a circuit diagram illustrating a relay examination device according to an example embodiment of the present disclosure.

FIG. 2 is a block diagram illustrating a relay examination device 1 and a battery management system according to an example embodiment. FIG. 3 is a circuit diagram illustrating a relay examination device 1 according to an example embodiment, illustrating an example embodiment in which the relay examination device 1 may examine a state of the second relay 40 (a negative electrode relay) connected between a negative electrode of a battery 10 and a system 20.

The relay examination device in the example embodiment may be configured to allow a current to flow to examine a state of the relay. For example, when the relay examination device examines a state of the negative electrode relay, the relay examination device 1 in the example embodiment may connect a separate power to one end of the negative electrode relay 40 disposed on the system 20 side, rather than the negative electrode terminal disposed on the battery 10 side, and may allow a current to flow to examine a state of the negative electrode relay 40.

The present disclosure may provide a circuit for determining a state of the relay, that is, whether the relay is connected or disconnected, and a battery management system including the same.

Referring to FIG. 2, the battery management system in the example embodiment may include a battery 10, a relay examination device 1, and a relay 40 having one end connected to a negative electrode of the battery and a ground and the other end connected to the relay examination device. The relay examination device 1 may include a power unit 50 configured to supply a current to the other end of the relay 40, a voltage detection unit 100 configured to detect a voltage from the other end of the relay 40, and a control unit 60 configured to examine whether the relay 40 is open or closed or whether the relay 40 malfunctions.

The battery management system in the example embodiment may use the power unit 50 as a separate power and may allow a current to flow to the relay 40 to determine a state of the relay 40. Depending on a state of the relay 40, a current supplied from the power unit 50 may flow through the voltage detection unit 100 and the relay 40 and may flow to a ground. In this process, the voltage detection unit 100 may detect a voltage signal of one end of the system 20 side of the relay 40, and the detected voltage signal may be provided to the control unit 60.

Referring to FIGS. 2 and 3, the voltage detection unit 100 may include a first resistor unit R1 having at least one end connected to the other end of the relay 40 and a second resistor unit R2 having one end connected to the other end of the first resistor unit R1 and the other end connected to the power unit 50. In example embodiments, to distinguish a state in which a current flows from a state in which a current does not flow, at least two resistors may be connected to each other, and a state of the relay 40 may be determined in response to receiving a voltage between the resistors.

When the relay 40 is open, a current may not flow such that a voltage between the first resistor unit R1 and the second resistor unit R2 may receive Vs, a power voltage, as an input voltage Vi and may determine that the relay 40 is opened. When the relay 40 is closed and a current flows, a voltage may decrease in accordance with a value of each of the first resistor unit R1 and the second resistor unit R2, and the control unit 60, implemented as a microprocessor, may receive a decreased voltage, decreased further than Vs, as the input voltage Vi such that the control unit 60 may determine that the relay is closed.

$$Vi=\{Vs\times(R1)/(R1+R2)\} \quad \text{[Equation 1]}$$

In an example embodiment, when the control unit 60 of the battery management system has an analog-digital converter (ADC) input function, the control unit 60 may directly receive the input voltage Vi.

The battery management system in the example embodiment may further include an analog-digital converter (ADC) 90 which may receive a voltage signal applied between the first resistor unit R1 and the second resistor unit R2 and may convert the control signal into a digital signal. In an example embodiment, the control unit 60 may receive a digital signal output from the analog-digital converter and may examine whether the relay 40 is open or closed and/or whether the relay 40 malfunctions.

Referring to FIG. 3, the battery management system in the example embodiment may further include a switch unit 80 which may connect the other end of the second resistor unit R2 to the power unit 50. Also, the switch unit 80 may be open or closed according to a control signal input from the control unit 60, and accordingly, the control unit 60 may be configured to close the switch unit 80 only when the control unit 60 wants to examine a state of the relay 40 by controlling the switch to be on/off. However, an example embodiment thereof is not limited thereto. In an example embodiment, the switch unit 80 may not be included, and the power unit 50 may be connected to the second resistor unit R2 anytime if necessary, and the power unit 50 may monitor a state of the relay 40 in real time.

A voltage of one end (④ in FIG. 1) disposed on the system 20 side may suddenly increase to a high voltage having a level the same as a level of a voltage of the battery 10 in accordance with a state or an operational condition of the system 20 to which power of the battery is supplied. In this case, a reverse current may flow to the relay examination device 1. To prevent this, the battery management system in another example embodiment may include a circuit protection unit 70 (e.g., a diode) having one end connected to the other end (④ in FIG. 1) of the negative electrode relay 40 and the other end connected to one end of the first resistor unit R1.

As described above, in example embodiments, the control unit, a microprocessor 60, may determine whether the relay 40 is open or closed based on a voltage signal input from the voltage detection unit 100.

The control unit 60 in example embodiments may also examine whether the relay 40 malfunctions. When a voltage of the input voltage Vi received by the control unit 60 is a value different from the Vs or different from a value represented in Equation 1, it may be determined that a problem has occurred in the relay 40, such as the malfunctioning of the relay 40.

Further, the relay examination device 1 in the example embodiment may include the fixed power 50 and the relay 40 such that the relay examination device 1 may include a single current loop. Accordingly, in addition to determining whether the relay 40 is open or closed, a resistor value of when a random resistance is applied may be calculated in accordance with the input voltage Vi. When the negative electrode relay has malfunctioned such that resistance as much as Rs is applied, rather than the negative electrode relay being completely open or closed, the value Rs may be calculated using Equation 2 as below:

$$Vi=\{Vs/(R1+Rs)/(R1+R2+Rs)\} \quad \text{[Equation 2]}$$

The power unit 50 applied to example embodiments may be indicated as a voltage source in FIGS. 2 and 3, but an example embodiment thereof is not limited thereto. The power unit 50 may also be implemented as a current source, rather than a voltage source, to provide a current to the voltage detection unit 100. In this case, in the circuit, the voltage source illustrated in FIGS. 2 and 3 may be replaced with a current source.

FIGS. 2 and 3 illustrate an example embodiment in which the relay examination device 1 is applied to examine the negative electrode relay 40, but an example embodiment thereof is not limited thereto. The relay examination device 1 may also examine the positive electrode relay 30. In this case, the relay examination device 1 may be connected to one of nodes disposed between the positive electrode relay 30 and the system 20.

The relay examination device 1 in the example embodiment may also be used to examine the negative electrode relay 40.

Referring to FIG. 1, a state of the positive electrode relay 30 may be examined by applying the relay examination device 1, or may be examined by comparing voltage levels of both ends of the relay (comparing V13 with V23). However, as there is no relative difference in voltages between the both ends of the negative electrode relay 40, it may be difficult to determine a state of the negative electrode relay 40 simply by a method of comparing the voltage levels. To determine a state of the negative electrode relay 40, a method of comparing voltages of the both ends of the relay with reference to a negative electrode of the battery, the method which may be used for the positive electrode relay 30, may not be used.

As another method for examine a state of the negative electrode relay 40, a method of comparing voltages of the both ends of the negative electrode relay 40 with reference to one end (①) in FIG. 1) of the positive electrode relay 30 may be considered. However, when the method is used, to compare voltages of a negative electrode with reference to a positive electrode of the battery, a voltage level may decrease lower than 0 (a negative number) such that, to correct this, a circuit may become complex.

As another method to examine a state of the negative electrode relay 40, a method of measuring a positive electrode (①) of a battery and comparing the positive electrode with reference to each of a negative electrode (③) of the battery and the negative electrode (④) of the system (e.g., a vehicle system) may be considered. However, in this case, two separate circuits having different reference voltages may be included such that a circuit may become complex.

It may be difficult to define an accurate difference in voltage levels on both ends of the positive electrode relay 30. Thus, to address the above-described issue, the relay examination device and the battery management system including the same in the example embodiment may use a method of allowing a current to flow, instead of using a method of measuring and comparing voltages. Accordingly, in the example embodiment, a state of the positive electrode relay 30 (in FIG. 1, for example) connected to a positive electrode of the battery 10 (in FIG. 1, for example), and also a state of the negative electrode relay 40 (in FIG. 1, for example) connected to a negative electrode of the battery may be determined accurately.

Thus, according to the example embodiments of the relay examination device and the battery management system including the same, by using a separate power 50, a state of the positive electrode relay 30 or the negative electrode relay 40 may be accurately examined without being affected by a level of voltages and changes in voltage of the battery 10.

Also, as a voltage power for a microprocessor, an analog-digital converter (ADC), and various circuits may be present in the battery management system, additional elements required for examining a state of the positive electrode relay 30 or the negative electrode relay 40 may be significantly reduced such that a circuit may be simplified and inexpensive, and a state of the negative electrode relay may be accurately examined.

In example embodiments, the term "unit," that is, "module" or "table" may refer to a hardware element such as a field programmable gate array (FPGA) or an application specific integrated circuit (ASIC), and the module may perform predetermined functions. The module is, however, not limited to software or hardware elements. The module may be configured to be included in a storage medium to be addressed, or may be configured to operate one or more processors. Thus, as an example, the module may include elements such as software elements, object-oriented software elements, class elements, and task elements, and may include processes, functions, properties, procedures, subroutines, segments of a program code, drivers, firmware, a microcode, a circuit, data, a database, data structures, tables, arrays, and variations. Functions provided in the elements and modules may be combined such that less number of elements and modules may be included, or the functions may be separated such that additional elements and modules may be included. Also, the elements and modules may be configured to operate one or more CPUs in a device.

According to the aforementioned example embodiments, according to the example embodiments of the relay examination device and the battery management system including the same, by using a separate power, a state of the relay may be accurately examined without being affected by a level and changes of a voltage of a high voltage battery.

Also, by reducing additional elements required for examining a state of the relay, a simplified and inexpensive circuit may be implemented and a state of the relay may be accurately examined.

While the example embodiments have been shown and described above, it will be apparent to those skilled in the art that modifications and variations could be made without departing from the scope of the present disclosure as defined by the appended claims.

What is claimed is:

1. A battery management system which examines whether a relay, coupled to an electrode of a battery in which a plurality of battery cells are coupled to each other, is open or closed or whether the relay has malfunctioned, the battery management system comprising:
   a relay examination device coupled to one end of the relay,
   wherein the relay examination device includes:
   a power unit configured to supply a current to the one end of the relay;
   a voltage detection unit configured to detect a voltage from the one end of the relay; and
   a control unit configured to examine whether the relay is open or closed or whether the relay has malfunctioned based on the voltage.

2. The battery management system of claim 1, wherein the voltage detection unit includes:
   a first resistor unit having a first end coupled to the one end of the relay; and
   a second resistor unit having a first end coupled to a second end of the first resistor unit and a second end coupled to the power unit,
   wherein the voltage detection unit detects a voltage signal applied between the first resistor unit and the second resistor unit.

3. The battery management system of claim 2, further comprising:
   a circuit protection unit having a first end coupled to the one end of the relay and a second end coupled to the first end of the first resistor unit.

4. The battery management system of claim 2, further comprising:
   a switch unit coupling the second end of the second resistor unit to the power unit,
   wherein the switch unit is in a first state, among first and second states, when the switch unit receives a control signal from the control unit, and is in the second state when no control signal is received from the control unit.

5. The battery management system of claim 2, further comprising:
   an analog-digital converter configured to receive a voltage signal applied between the first resistor unit and the second resistor unit and to convert the voltage signal into a digital signal,
   wherein the control unit receives the digital signal and examines whether the relay is open or closed or whether the relay has malfunctioned.

6. A relay examination device, which examines a relay coupled to an electrode of a battery for supplying a power to a system, comprising:

a first resistor unit having a first end coupled to one end of the relay;

a second resistor unit having first end coupled to a second end of the first resistor unit;

a power unit coupled to a second end of the second resistor unit and configured to supply power; and a control unit configured to receive a voltage signal applied between the first resistor unit and the second resistor unit and to examine whether the relay is open or closed or whether the relay has malfunctioned, wherein the power unit, the first resistor, the second resistor and the relay constitute a circuit loop excluding the battery and the system.

7. The relay examination device of claim 6, further comprising:

an analog-digital converter configured to receive a voltage signal applied between the first resistor unit and the second resistor unit and to convert the voltage signal into a digital signal, wherein the control unit examines whether the relay is open or closed or whether the relay has malfunctioned in response to receiving the digital signal.

8. The relay examination device of claim 6, further comprising:

a switch unit coupling the second end of the second resistor unit to the power unit.

9. The relay examination device of claim 8, wherein the switch unit is in a first state, among first and second states, when the switch unit receives a control signal from the control unit, and is in the second state when no control signal is received from the control unit.

10. The relay examination device of claim 6, further comprising:

a circuit protection unit having a first end coupled to the one end of the relay and a second end coupled to the first end of the first resistor unit.

11. A relay examination device, comprising:

a power source;

a voltage divider having two resistive elements and coupled to the power source, the voltage divider being configured to be coupled to an end of a relay in a battery system to determine a state of the relay; and a controller configured to receive an output voltage from a node between the two resistive elements of the voltage divider to determine a state of the relay, wherein the value of the output voltage is in accordance with the values of the two resistive elements of the voltage divider and an input voltage of the power source when the switch is closed, and wherein the value of the output voltage is in accordance with the values of the two resistive elements of the voltage divider, another resistance value, and the input voltage of the power source when the switch malfunctions.

* * * * *